(12) United States Patent  (10) Patent No.: US 6,285,172 B1
Torbey                    (45) Date of Patent:    Sep. 4, 2001

(54) DIGITAL PHASE-LOCKED LOOP CIRCUIT WITH REDUCED PHASE JITTER FREQUENCY

(75) Inventor: Elie Torbey, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/711,772

(22) Filed: Nov. 13, 2000

(51) Int. Cl.$^7$ ............... G05F 1/10; G05F 1/40; G05F 3/16
(52) U.S. Cl. ............ 323/237; 323/241; 323/322
(58) Field of Search ............. 323/320, 322, 323/323, 300, 237, 241

(56) References Cited

U.S. PATENT DOCUMENTS

| | | | |
|---|---|---|---|
| 4,307,346 | * 12/1981 | Kurosawa et al. | 328/155 |
| 5,157,342 | * 10/1992 | Atwood et al. | 328/155 |
| 5,281,863 | * 1/1994 | Bond et al. | 307/271 |
| 5,355,037 | 10/1994 | Andresen et al. | 307/602 |
| 5,544,203 | 8/1996 | Casasanta et al. | 375/376 |
| 6,215,363 | * 4/2001 | Conta et al. | 331/17 |
| 6,222,745 | * 4/2001 | Amaro et al. | 363/65 |

\* cited by examiner

*Primary Examiner*—Peter S. Wong
*Assistant Examiner*—Bao Q. Vu
(74) *Attorney, Agent, or Firm*—Wade James Brady, III; Frederick J. Telecky, Jr.

(57) ABSTRACT

A digital phase-locked loop (DPLL) (22) for use in one or more integrated circuits (20) that may be combined within an electronic system is disclosed. The DPLL (22) includes a phase detector (30) that generates a shift clock and a shift direction signal responsive to a phase difference between a system clock and a feedback clock. The shift direction signal is stored in a latch (32), applied to one input of an exclusive-NOR gate (34), and to shift direction inputs (R/L̄) of first and second digital delay lines (38, 42). The first digital delay line (38) receives the system clock and generates a delayed clock that is distributed within the integrated circuit (20) by clock distribution circuitry, and that is applied to an input of the second digital delay line (42); the second digital delay line (42) generates the feedback clock that is received by the phase detector (30). The shift clock is gated from application to the first and second digital delay lines according to the comparison of the current shift direction with that stored in the latch (32), such that the shift clock is applied to the shift clock input of the first digital delay line (38) to adjust its delay only upon the phase detector (30) detecting a phase differential of the same polarity at least twice in a row; the shift clock is applied to the shift clock input of the second digital delay line (42) upon the phase detector (30) detecting opposite phase differentials in the current and previous phase detection events.

18 Claims, 2 Drawing Sheets

DIGITAL PHASE-LOCKED LOOP CIRCUIT WITH REDUCED PHASE JITTER FREQUENCY

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to circuitry for synchronizing clocked integrated circuits with an external clock.

As is fundamental in the art, many modern electronic systems now include numerous integrated circuits that operate in conjunction with one another. Particularly in complex high performance systems such as modern personal computers and workstations, these integrated circuits typically operate in a synchronous manler relative to a system clock. Examples of these integrated circuits include the central processing unit (CPU) of the system, typically an instruction-programmable device such as a microprocessor or digital signal processor (DSP), other programmable devices such as memory controllers, timers, and input/output devices, and also general purpose digital logic for controlling system operation and communication. In smaller systems, such integrated circuits may also correspond to custom control functions. Many modern digital logic integrated circuits are now realized in a semi-custom manner, for example by way of a gate array, or by way of an application specific integrated circuit (ASIC) which implements a selected arrangement of circuit functions into a single integrated circuit.

Because of the finite resistance of conductive lines and differences in signal distance among the integrated circuits, as well as variations in propagation delay among the various circuits in a system, the synchronous operation of the integrated circuits in a system is not inherently guaranteed. Differences in the instantaneous phase of clock signals within an integrated circuit and among multiple integrated circuits in the system, and also variations in these phase differences over time, require delay stages or wait states in the operation of the integrated circuits to ensure reliable synchronous operation and signal communication within a system or subsystem. In order for the overall performance of the system to be maximized, it is important that the synchronous operation of each circuit be synchronized with the system clock itself, and thus with one another.

A conventional approach for synchronizing the operation of an integrated with a system clock is the well-known phase-locked loop, or PLL. PLLs are often deployed in clock distribution circuitry of an integrated circuit, so that internal clock signals may be generated and distributed within the circuit that are maintained at a fixed phase relationship relative to the system clock. Each integrated circuit in the system that utilizes a PLL to generate such phase-synchronous internal clocks will therefore be operating synchronously (i.e., in a fixed phase relationship) with one another, minimizing the necessity of delay in the communication of signals among these synchronized circuits.

In general, PLL circuits operate by comparing the time at which an edge of the system clock is received relative to a corresponding edge of an internally generated clock. If a significant delay between these two edges is detected, the generation of the internal clock is adjusted to more closely match the received system clock. To accomplish this, PLL circuits in modern circuits may be realized in either analog or digital form. In an analog PLL, the frequency of a periodic signal produced by a voltage controlled oscillator is adjusted in response to a filtered signal from a phase detector, such that the instantaneous frequency of the internal chip clock is advanced or retarded depending upon whether the chip clock lags or leads the system clock. Analog PLLs therefore adjust the phase of the chip clock in a substantially continuous manner in response to a phase difference between the internal chip clock and the system clock; this smooth operation generally depends upon the filtering of the output of the phase detector circuit, but can be made quite well-behaved in most implementations. However, analog PLL are typically somewhat complex to implement, especially in high performance digital integrated circuits.

In a digital PLL, the length of a digital delay line is adjusted in response to the chip clock leading or lagging the system clock. FIG. 1 illustrates a generalized block diagram of a conventional digital PLL. As shown therein, the system clock is applied to a first input of phase detector 11, and to an input (A) of digital delay line 15; a chip clock signal generated by the PLL itself is applied to a second input of phase detector 11. In this conventional digital PLL, digital delay line 15 is a controllable series of delay stages by way of which its output signal (Y) is generated as a delayed version of the incoming system clock signal, with an adjustable delay therebetween. A shift clock on line CLK is also generated by phase detector 11, in response to a phase difference between the chip and system clocks, and is applied to digital delay line 15 to shift a tap point therein in a direction corresponding to the state of line R/$\overline{L}$ from phase detector 11. The control signal on line R/$\overline{L}$ is generated by phase detector 11 according to the polarity of the phase difference between corresponding edges of the system clock signal and the chip clock signal. Clock distribution circuitry 17 receives the output clock signal (Y) from digital delay line 15, and generates and distributes clock signals throughout the remainder of the corresponding integrated circuit, including the chip clock signal that is applied to phase detector 11.

In operation, phase detector 11 generates a pulse of its shift clock on line CLK in response to detecting a phase difference between the system clock and the chip clock signal that exceeds a threshold time. This shift clock pulse from phase detector 11 shifts the position of a tap point within digital delay line 15 to adjust its delay length between the receipt of an edge at input A and the generation of the edge at output Y; the adjustment is made in the direction indicated by the state of line R/$\overline{L}$ from phase detector 11. In response to the chip clock signal leading the system clock, phase detector 11 will drive line R/$\overline{L}$ high so that, upon a pulse of the shift clock on line CLK, digital delay line 15 lengthens its delay by one step, further delaying the output signal from the system clock signal. Conversely, if the system clock is leading the chip clock signal, phase detector 11 drives a low level on line R/$\overline{L}$, to reduce the delay in digital delay line 15 upon receipt of a shift clock pulse on line CLK, incrementally advancing the chip clock signal relative to the system clock. Over a sufficient number of cycles and adjustments, the conventional digital PLL of FIG. 1 will eventually generate and distribute clock signals that are in a fixed phase relationship with the system clock.

As compared with analog PLLs, digital PLLs are relatively straightforward to implement and simulate in the design cycle, and generally exhibit good noise immunity. Additionally, considering that no external components are typically required for digital PLLs and that the digital PLL may be realized by similar circuit elements as used elsewhere in the digital integrated circuits, many modern integrated circuits now include digital PLL circuitry for synchronizing their internally generated on-chip clocks with external system clocks.

As noted above, analog PLLs adjust the chip clock phase in a substantially continuous manner. In contrast, however, digital PLLs can only adjust the phase relationship between the internal chip clock and the system clock to a discrete accuracy that corresponds to the minimum step size of the digital delay line. This granularity is due to the operation of the digital PLL, once the chip clock reaches substantially the phase of the system clock, in adding or subtracting the smallest delay step to or from the digital delay line in response to a detected phase difference between the chip clock and the system clock. This incremental change in phase is often noticeable, particularly at high frequencies, as a jump in the phase relationship of the two clocks. The resulting "phase jitter" is now a commonly specified parameter for digital PLLs, as this effect is often a limiting factor in the accuracy and performance of the circuit.

Conventional digital PLLs have addressed the issue of phase jitter in several ways. For example, as described in U.S. Pat. No. 5,544,203, commonly assigned herewith and incorporated hereinto by this reference, phase jitter amplitude is reduced by the combination of a coarse delay element with a fine delay element. In this way, the ultimate minimum delay stage step can be maintained to be relatively small, while permitting the coarse delay stage to rapidly adjust the internal chip clock to the desired locked phase relationship. However, the frequency of phase jitter is not reduced in this approach.

So-called "lock and hold" digital PLLs are also known in the art to reduce phase jitter. FIG. 2 illustrates one example of a lock and hold digital PLL, using the same reference numerals as used in FIG. 1 to refer to common elements therewith. In the lock and hold digital PLL of FIG. 2, NAND gate 14 generates the shift clock applied to digital delay line 15 on line SCLK; line R/$\overline{L}$ is applied to one input of NAND gate 14 and the shift clock output (inverted) from phase detector 11 is applied to the other input. The operation of the PLL of FIG. 2 begins with the chip clock considered to be in advance of the system clock, so that the control signal on line R/$\overline{L}$ indicates right shifts of the delay length in response to each pulse of the shift clock on line CLK (which is passed through to digital delay line SCLK by NAND gate 14 because of the high logic level on line R/$\overline{L}$). Once the chip clock is delayed to lag the system clock, in which case the control signal on line R/$\overline{L}$ from phase detector will be inactivated, NAND gate 14 will then block shift clock pulses on line CLK from reaching digital delay line 15. As a result, variations in the phase of the chip clock signal around the edge of the system clock signal will not cause phase jitter, as the delay through digital delay line 15 will no longer be adjusted However, should the chip clock signal become further delayed relative to the system clock after the lock condition, as may occur with changing environmental conditions, increased junction temperature of the integrated circuit, or because of noise in the system, the digital PLL of FIG. 2 will not be able to advance the chip clock signal until either the phase lag becomes so long that the chip clock signal appears to lead the system clock. As such, while valid and simple to implement, the digital PLL of FIG. 2 is not stable over all conditions.

FIG. 3 illustrates another conventional digital PLL circuit including a lock and hold feature. In this example, phase detector 11 directly applies the shift clock on line CLK and the control signal on line R/$\overline{L}$ to digital delay line 15, as in the PLL of FIG. 1. The lock and hold feature is provided in the circuit of FIG. 3 by way of AND gates 16 and 18. AND gate 16 receives the system clock signal at one input, while AND gate 18 receives the chip clock signal at one input; line R/$\overline{L}$ is applied to second inputs of each of AND gates 16, 18. The outputs of AND gates 16, 18 are applied to the inputs of phase detector 11, such that phase detector 11 detects phase differences between the signals at the outputs of AND gates 16, 18 and generates a shift clock pulse on line CLK and a shift direction signal on line R/$\overline{L}$ responsive thereto. In this example, the system clock and the chip clock are applied, by AND gates 16,18, to phase detector 11 so long as the chip clock signal leads the system clock (i.e., so long as line R/$\overline{L}$ is driven high to lengthen the delay through digital delay line 15). Once the delay of digital delay line 15 is lengthened by shift clock pulses on line CLK so that the chip clock signal lags the system clock by a detectable phase difference, phase detector 11 will drive line R/$\overline{L}$ low and cause AND gates 16, 18 to block the application of the system clock and the chip clock from the inputs of phase detector 11. At this point, with no further clock edges of the system clock and the chip clock reaching phase detector 11, no further adjustment of the delay through digital delay line 15 can be made. Phase jitter that occurs by slight variations of the chip clock relative to the system clock will thus be blocked. However, the implementation of the digital PLL of FIG. 3 requires a great deal of care, particularly in providing equidistant positioning of matched AND gates 16, 18 from the inputs of phase detector 11, considering that any mismatch in the propagation delay through gates 16, 18 will degrade the phase matching of the chip clock relative to the system clock. Furthermore, care must be taken relative to the timing of the transition at the output of phase detector 11 at line R/$\overline{L}$ so that gated clock glitches are avoided. Still further, while the circuit of FIG. 3 permits locking either in the left or right direction, this circuit precludes the correction of phase drift.

In either case, the circuits of FIGS. 2 and 3 eliminate phase jitter by locking and holding the delays upon the chip clock signal becoming matched to the system clock, thus providing potentially greater available datapath margin. However, the inability of the PLLs of FIGS. 2 and 3 to respond to phase drift due to temperature and power supply voltage variations, and due to noise, can degrade the overall clock skew in the system.

BRIEF SUMMARY OF THE INVENTION

It is therefore an object of the present invention to provide a digital phase-locked loop (PLL) circuit in which phase jitter frequency is reduced while providing the ability to continue to adjust internal clock signals for phase drift over time.

It is a further object of the present invention to provide such a PLL circuit which may be readily implemented into modern digital circuits.

It is a further object of the present invention to provide such a PLL circuit which reduces phase jitter frequency without adversely affecting the rate at which phase lock is reached.

It is a further object of the present invention to provide such a PLL circuit which minimizes power consumption by advantageously disabling delay chain clocks.

Other objects and advantages of the present invention will be apparent to those of ordinary skill in the art having reference to the following specification together with its drawings.

The present invention may be implemented into a digital phase-locked loop (PLL) circuit by gating the generation of shift clock signals to the digital delay line with an exclusive-OR of the current phase relationship of the system clock and chip clock and a previously detected phase relationship of the system and chip clocks. This gating enables adjustment of the digital delay line only when successive phase differences of the same polarity are detected. The chip clock that is applied to the phase detector is delayed by a second digital delay line that is adjusted responsive to phase differences detected when the primary digital delay line is blocked, providing correct phase detection.

DETAILED DESCRIPTION OF THE INVENTION

As will be apparent from the following description, the present invention may be beneficially used in connection with many different alternative implementations of electronic circuits and systems. It is therefore contemplated that those skilled in the art having reference to this description will be readily able to implement the present invention in many alternative realizations, over a wide range of electronic functions and systems. As such, it will be understood that the following description is provided by way of example only.

Figure 4:
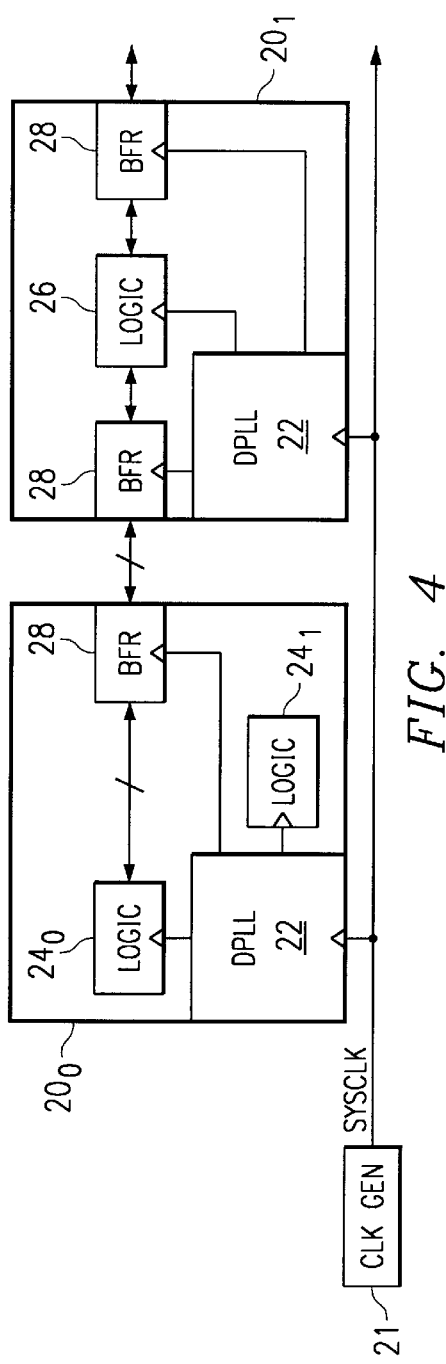
FIG. 4 is an electrical diagram, in block form, of an electronic system incorporating digital PLL circuits according to the preferred embodiment of the present invention.

FIG. 4 generically illustrates an electronic system in connection with which the preferred embodiment of the present invention is implemented. Multiple integrated circuits 20 are provided in this exemplary system, for carrying out the function of the system. Integrated circuits 20 may correspond to instruction-programmable logic devices, such as microprocessors or digital signal processors (DSPs), custom logic devices, semi-custom logic devices such as application specific integrated circuits (ASICs), general purpose logic, or combinations thereof. Integrated circuits 20 in this exemplary system operate in a synchronous fashion relative to a system clock generated on line SYSCLK by clock generator circuit 21, which is applied to each of integrated circuits 20. Clock generator circuit 21 is a conventional clock generator circuit for generating this system clock, constructed according to conventional techniques; for example, clock generator circuit 21 may be a crystal oscillator circuit for generating a periodic signal corresponding to the frequency of oscillation of an external crystal. Alternatively, for example if the system of FIG. 4 corresponds to a subsystem that is implemented on a card for a computer system, clock generator circuit 21 may itself receive an externally generated clock signal and distribute the system clock signal on line SYSCLK based upon this received signal.

The system of FIG. 4 includes, as noted above, multiple integrated circuits 20 (two of which are shown in the Figure). According to the preferred embodiment of the present invention, each integrated circuit 20 includes a digital phase-locked loop (DPLL) 22 that receives the system clock on line SYSCLK from clock generator circuit 21, generates one or more clock signals in a fixed phase relationship with the system clock, and distributes these synchronized clock signals to various circuit functions within its corresponding integrated circuit 20. For example, DPLL 22 within integrated circuit $20_0$ generates synchronized clock signals and applies these clocks to logic functions $24_0$, $24_1$ and to clocked buffer 28; in integrated circuit $20_1$ of FIG. 4, its DPLL 22 generates such clock signals for application to buffers 28 and logic 26. Logic functions 24, 26 in integrated circuits $20_0$, $20_1$, respectively, are circuits for performing the desired and appropriate logic functions for their associated integrated circuits 20.

Integrated circuits 20 in the system of FIG. 4 operate in a synchronous manner relative to one another, by way of each integrated circuit 20 operating in a synchronous manner relative to the system clock on line SYSCLK, under the control of their respective DPLL 22. Such synchronous operation is particularly important for purposes of high-speed data exchange between respective buffers 28 of integrated circuits $20_0$, $20_1$, in order to maximize the performance of the system; poor synchronization and varying clock relationships between buffers 28 of integrated circuits $20_0$, $20_1$ will, of course, require wider timing margins for data communication, and thus reduce the system performance. In addition, synchronous operation among the various circuits within each integrated circuit $20_0$, $20_1$ will maximize its internal performance, as well.

Figure 5:
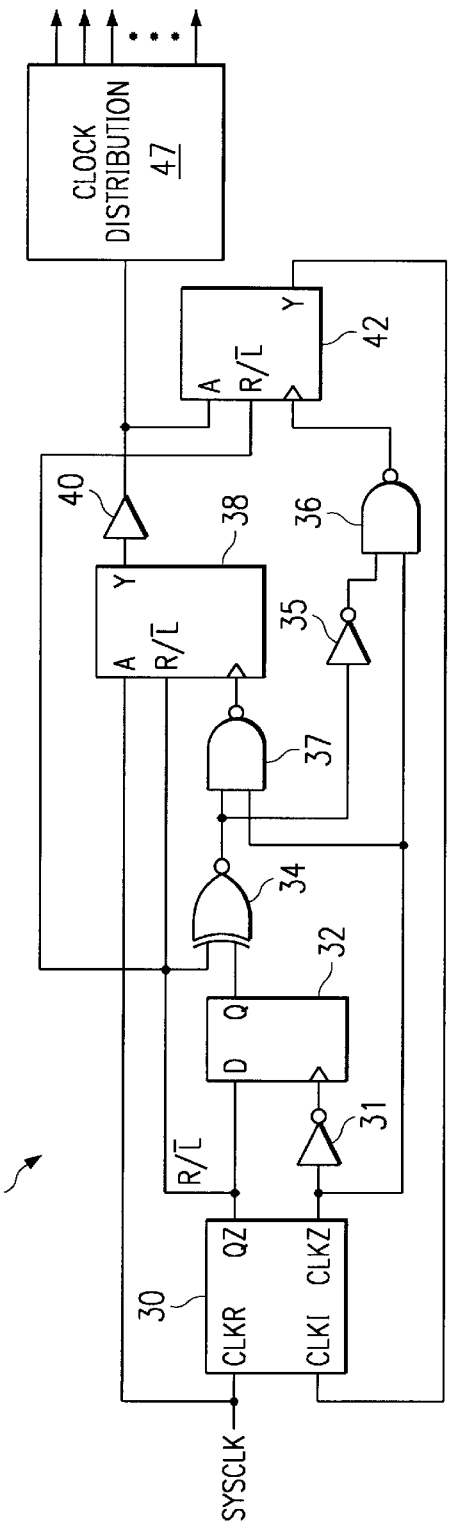
FIG. 5 is an electrical diagram, in block and schematic form, of a digital PLL circuit according to the preferred embodiment of the present invention.

Referring now to FIG. 5, the construction of DPLL 22 according to the preferred embodiment of the invention will now be described. In particular, the construction of DPLL 22 described herein corresponds to that which may be implemented by way of standard cells selected for realization in an ASIC device. Of course, custom logic or other realizations of DPLL 22 may alternatively be used, as desired. These and other various alternative implementations of DPLL 22 according to the present invention will be apparent to those of ordinary skill in the art having reference to this specification, such alternative implementations being contemplated to fall within the scope of the present invention as hereinafter claimed. As such, the construction of DPLL 22 as shown in FIG. 5 is presented by way of example only.

DPLL 22 in FIG. 5 includes phase detector 30, which receives system clock SYSCLK at its CLKR input, and receives a feedback clock from within DPLL 22 at its CLKI input. The generation of the feedback clock to phase detector 30 will become apparent from the following description. Phase detector 30 is of conventional construction, such as the DLP41 standard cell available from the TGC4000 library of Texas Instruments Incorporated. Phase detector 30, as conventional for such functions, compares the relative phases of the clock signals received at its CLKR, CLKI inputs. Upon the phase difference, or time lag, between edges of these clock signals varying by more than a detection threshold, phase detector 30 issues a shift clock pulse at its CLKZ output, and issues a shift direction signal by driving a logic level at its QZ output, onto line R/$\overline{L}$, that indicates the relative phases of the two clocks. In this example, phase detector 30 issues an active high level at its QZ output responsive to the system clock SYSCLK at its CLKR input lagging the feedback clock at its CLKI input, and issues an inactive or low level at its QZ output responsive to the system clock SYSCLK at its CLKR input leading the feedback clock at its CLKI input.

Line R/$\overline{L}$ at the QZ output of phase detector 30 is connected to the D input of D-type latch 32, while the CLKZ output of phase detector 30 is applied to the clock input of latch 32, via inverter 31. Latch 32 serves to store the most recent state of line R/$\overline{L}$ upon the end of the clock cycle output by phase detector 30, presenting this stored state at its Q output to one input of an exclusive-OR function, which in this case is exclusive-NOR gate 34. Of course, either an exclusive-OR gate and an exclusive-NOR gate may serve this exclusive-OR function, depending upon the desired logic polarity of its output. In this example, the output of exclusive-NOR gate 34 is connected to one input of NAND gate 37, and the CLKZ output of phase detector 30 is connected to a second input of NAND gate 37.

Figure 1:
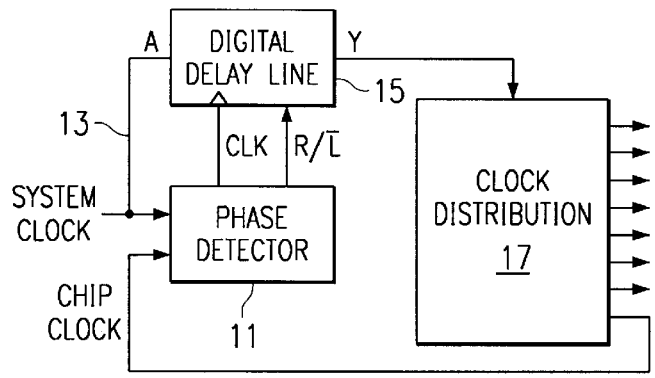
FIG. 1 is an electrical diagram, in block and schematic form, of a conventional digital phase-locked loop (PLL) circuit.
Figure 2:
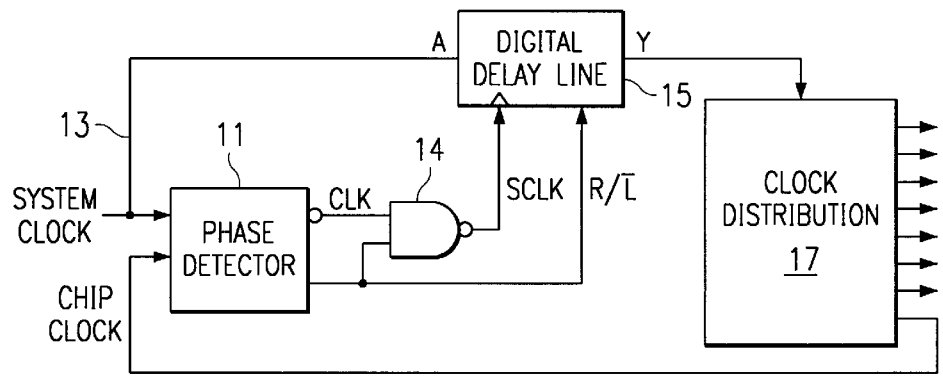
FIG. 2 is an electrical diagram, in block and schematic form, of a conventional digital PLL circuit having a lock and hold feature.
Figure 3:
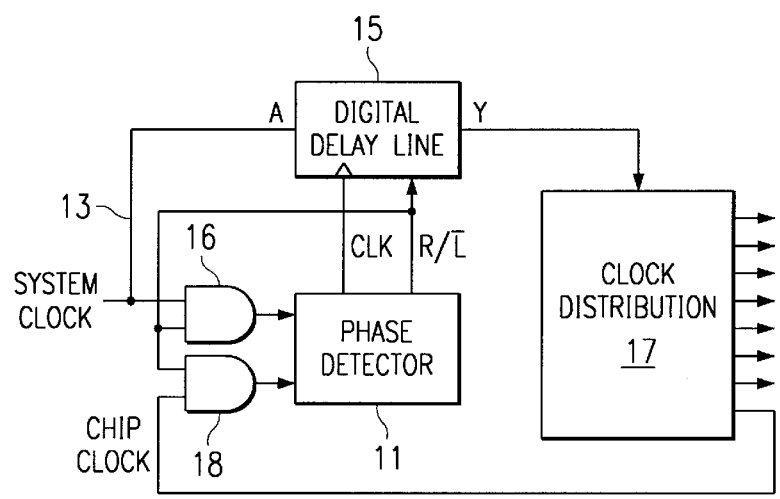
FIG. 3 is an electrical diagram, in block and schematic form, of another conventional digital PLL circuit having a lock and hold feature.

Line R/$\overline{L}$ is also connected to a second input of exclusive-NOR gate 34, and to the R/$\overline{L}$ input of digital delay line 38. Digital delay line 38 receives system clock SYSCLK at its A input, and the output of NAND gate 37 at its shift clock input. Digital delay line 38 is a conventional circuit function for performing the shiftable delay function used in conventional DPLLs, as described above relative to FIGS. 1 through 3. An example of a conventional digital delay element useful as digital delay line 38 according to the preferred embodiment of the present invention is the DLE23 standard cell from the TGC4000 library available from Texas Instruments Incorporated. In this regard, digital delay line 38 generates, at its Y output, a clock signal that is delayed from the input clock signal received at its A input by a delay that is shiftable in response to signals received at its shift clock and R/$\overline{L}$ inputs. In response to a clock pulse at its shift clock input, digital delay line 38 will lengthen its delay by an increment if a high level is then present at its R/$\overline{L}$ input, and reduces its delay by this increment if a low level is then present thereat.

The Y output of digital delay line 38 is applied to clock distribution circuit 47, via clock buffer 40. Clock distribution circuit 47 is a conventional circuit for receiving a clock signal and for distributing this clock signal, and also clocks generated therefrom by clock distribution circuit 47 itself, throughout the remainder of integrated circuit 20 containing DPLL 22; as such, clock distribution circuit 47 includes clock generation circuits therewithin, such as frequency dividers and the like. Clock distribution circuit 47 is of conventional construction, such as used in conventional DPLLs as described above relative to FIGS. 1 through 3.

The clock generated by digital delay line 38 at its Y output is also forwarded, after buffering by clock buffer 40, to the A input of digital delay line 42. Digital delay line 42 may be of similar construction and function as digital delay line 38, and therefore has an R/$\overline{L}$ input and a shift clock input. The maximum delay length of digital delay line 42 is preferably much shorter than that of digital delay line 38, however; indeed, as will become apparent from the following description, digital delay line 42 may include as few as two delay stages. The R/$\overline{L}$ input of digital delay line 42 receives line R/$\overline{L}$ as generated from the QZ output of phase detector 30. The shift clock input of digital delay line 42 receives a signal generated by NAND gate 36, which has the shift clock output CLKZ of phase detector 30 applied to one input, and the output of exclusive-NOR gate 34, inverted by inverter 35, applied to its second input. Digital delay line 42 generates, at its Y output, the feedback clock signal that is applied to the CLKI input of phase detector 30, and against which phase detector 30 compares the timing of edges of system clock SYSCLK.

As is apparent from the foregoing description, DPLL 22 utilizes two separate digital delay lines 38, 42. Digital delay line 38 controls the generation of the clocks that are actually applied to functional circuits elsewhere within integrated circuit 20, while digital delay line 42 generates the feedback clock for use in the phase detection and delay adjustment processes. The delays produced by digital delay lines 38, 42 are separately adjusted, however. As will be apparent from the following description of the operation of DPLL 22, this construction of DPLL 22 reduces the frequency of phase jitter in the output clock signals from clock distribution circuit 47.

The following description of the operation of DPLL 22 will begin from an initial condition in which the system clock on line SYSCLK lags the feedback clock applied to the CLKI input of phase detector 30; as will be apparent from the following description, DPLL 22 will equivalently lock from the state in which the system clock on line SYSCLK initially leads the feedback clock. If appropriate, an initializing clock (not shown) may provide a selected initial condition of the feedback clock, upon circuit reset. Upon the detection of at least a threshold phase difference in the rising edges of system clock SYSCLK received at its CLKR input and the feedback clock at its CLKI input, phase detector 30 issues a pulse at its CLKZ output and (in this case where the system clock lags) also a high level at its QZ output that is applied to line R/$\overline{L}$. This high level on line R/$\overline{L}$ is forwarded to the R/$\overline{L}$ inputs of digital delay lines 38, 42, and to the D input of latch 32. Upon the lagging edge at the end of the pulse at the QZ output of phase detector 30, after inversion by inverter 31, clocks in the high level on line R/$\overline{L}$ into latch 32.

Meanwhile, system clock SYSCLK is applied directly to the A input of digital delay line 38, which generates a delayed version thereof at its Y output for distribution by clock distribution circuit 47 to elsewhere in integrated circuit 20. Additionally, this output clock from digital delay line 38, via clock buffer 40, is also applied to the A input of digital delay line 42 which, in turn, generates a delayed version therefrom at its Y input that is applied back to the CLKI input of phase detector 30.

In the next clock cycle, upon the detection of the edges of the system clock and feedback clocks at a similar phase relationship as in the previous cycle, phase detector 30 will maintain the high level at its QZ output on line R/$\overline{L}$. This level is directly applied to one input of exclusive-NOR gate 34. Because the previously latched state of latch 32 was also a high level (and now appears at the second input of exclusive-NOR gate 34 from the Q output of latch 32), exclusive-NOR gate 34 applies a high level to one input of NAND gate 37. The shift clock pulse generated by phase detector 30 at its CLKZ output in response to the input clock edges is then passed by NAND gate 37 to the clock input of digital delay line 38, which effects an incremental lengthening (line R/$\overline{L}$ being high) of the delay length of digital delay line 38. The clock generated at the Y output of digital delay line 38 is thus incrementally delayed further relative to the system clock on line SYSCLK. This delayed clock is forwarded by clock buffer 40 to clock distribution circuitry 47 for the generation and distribution of clock signals throughout integrated circuit 20, and also to digital delay element 42 from which the feedback clock to be applied to the CLKI input of phase detector 30 is generated. The incremental lengthening of the delay of digital delay line 38 thus has the effect of bringing the feedback clock at the Y output of digital delay line 42 incrementally closer to alignment with the system clock on line SYSCLK.

The high level driven by exclusive-NOR gate 34 appears as a low level input to NAND gate 36, through the action of inverter 35. In this event, the shift clock generated by phase detector 30 at its CLKZ output, in response to the detected phase lag in the system clock on line SYSCLK relative to the feedback clock, is blocked by NAND gate 36 from appearing at the shift clock input of digital delay line 42. The high level state of line R/$\overline{L}$ applied to the R/$\overline{L}$ input of digital delay line 42 thus has no effect upon the delay length of digital delay line 42. Of course, the incremental lengthening of the delay through digital delay line 38 has the effect of incrementally delaying the edge of the clock at the Y output of digital delay line 42, as the delay between the feedback clock from digital delay line 42 relative to the system clock on line SYSCLK corresponds to the sum of the delays through both digital delay lines 38, 42 (plus the propagation delay through other intervening devices).

Each succeeding clock period in which the system clock on line SYSCLK lags the feedback clock at the CLKI input of phase detector 30 continues this operation, as each shift clock pulse generated at the CLKZ output of phase detector 30 is passed through to digital delay line 38 in combination with the maintained high level on line R/$\overline{L}$. This incrementally lengthens the delay of the feedback clock. Eventually, however, the delay length of digital delay line 38 will be increased sufficiently that the system clock on line SYSCLK will lead the feedback clock signal generated at the Y output of digital delay line 42.

Upon the first instance of the system clock on line SYSCLK leading the feedback clock generated by digital delay line 42, phase detector 30 will generate a low level at its QZ output and thus upon line R/$\overline{L}$, indicating that a left shift, or incremental reduction of the delay length, is appropriate. The corresponding input of exclusive-NOR gate 34 thus also receives a low logic level. However, because this is the first instance of this phase relationship, the previously stored state of line R/$\overline{L}$ at the Q output of latch 32 is at a high level, and is also applied to exclusive-NOR gate 34. The opposite states at the inputs of exclusive-NOR gate 34 causes its output to be driven low. NAND gate 37 will then block any shift clock pulse generated by phase detector 30 from being applied to the shift clock input of digital delay line 38.

As a result, the first leading phase cycle detected by phase detector 30 will not cause the output clock generated by digital delay line 38 to be at an adjusted phase; rather, the delay through digital delay line 38 is maintained at the same relationship as in the previous cycle.

However, the low logic level at the output of exclusive-NOR gate 34, after inversion by inverter 35, enables NAND gate 36 to pass the state of the CLKZ output of phase detector 30 to the shift clock input of digital delay line 42. Because line R/$\overline{L}$ is at a low level, however, the delay length of digital delay line 42 is incrementally reduced in response to the pulse applied by NAND gate 36 to its shift clock input. This incremental advancing of the feedback clock at the Y output of digital delay line 42 then appears at the CLKI input of phase detector 30 for the next system clock cycle. At this point, the operation of DPLL 22 may be considered to be "locked".

The operation of DPLL 22 will then continue in this manner while in the locked state. In short, NAND gate 37 blocks the application of any shift clock pulses generated by phase detector 30 at its CLKZ output for every cycle in which the new state of line R/$\overline{L}$ at the QZ output of phase detector 30 differs from its state in the previous cycle; in other words, the delay of digital delay line 38 is not adjusted in cycles in which the phase relationship between the system and feedback clocks differs in sign (lead versus lag) from the previous phase detection event (which may or may not have occurred in the previous system clock cycle). In these cycles, the adjustment of the feedback clock delay is made by digital delay line 42, as the opposite states of line R/$\overline{L}$ in successive cycles, as presented by latch 32 and exclusive-NOR gate 34, cause NAND gate 36 to pass the shift clock to digital delay line 42. This operation permits the feedback clock to be adjusted toward the system clock on line SYSCLK, but this incremental adjustment does not appear on the clocks generated and distributed by clock distribution circuitry 47, as the delay through digital delay line 38 is not adjusted.

In the event of clock drift following lock, however, such as may occur as a result of junction temperature increases, power supply voltage modulations, or noise in the system, digital delay line 38 is able to respond. Such drift is indicated by two or more successive phase detections (which may or may not occur in successive system clock cycles) having the same phase relationship as detected by phase detector 30. If line R/$\overline{L}$ is driven low in two successive cycles (feedback clock lags the system clock in two successive cycles) or high in two successive cycles (feedback clock leads the system clock in the two successive cycles), exclusive-NOR gate 34 will drive its output to a high level, enabling NAND gate 37 to pass the shift clock pulses from the CLKZ output of phase detector 30 to the shift clock input of digital delay line 38. Digital delay line 38 will then incrementally modify its delay length in the direction indicated by the current state of line R/$\overline{L}$, in order to correct the phase drift and to bring DPLL 22 back into a locked state.

According to the present invention, therefore, the effects of phase jitter are thus blocked from appearing upon the actual clocks used in the execution of logic and other operations, for example as distributed by clock distribution circuitry 47 in DPLL 22 of FIG. 5. As a result, the integrated circuit incorporating the present invention will have improved stability of operation following lock, as the frequency with which phase adjustments are required will be greatly reduced. Indeed, it is contemplated that, in the absence of noise or drift, phase jitter will be completely eliminated; in any event, any phase jitter that is caused by the DPLL itself around the lock point will not appear on the distributed circuit clocks. This reduction or elimination in phase jitter is obtained in a manner that still permits correction of the internal chip clocks in the event of drift; additionally, lock may be achieved in either direction (i.e., from either a system clock lead or lag state), as opposed to many conventional lock and hold circuits. Furthermore, it is contemplated that these benefits will be obtained without an increase in the power consumption of the circuit, as at most one of the digital delay lines is adjusted in each clock cycle.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A digital phase-locked loop circuit, comprising:
    a phase detector, having a first input for receiving a system clock and a second input for receiving a feedback clock, for generating a shift signal at a shift clock output responsive to detecting a phase difference between the system and feedback clocks, and for generating a direction signal at a direction output indicating which of the system and feedback clocks leads the other;
    a latch, for storing the state of the direction signal;
    an exclusive-OR function, having a first input coupled to the output of the latch and a second input coupled to receive the direction signal from the phase detector, for comparing the contents of the latch corresponding to a stored state of the direction signal with the current state of the direction signal;
    a first digital delay line, having an input coupled to receive the system clock, for generating a first delayed clock from the system clock, the first digital delay line having a direction input coupled to the direction output of the phase detector, and having a shift clock input, the first digital delay line having a delay length that is selectively incremented or decremented according to a signal at its direction input, responsive to receiving a shift signal at the shift clock input;
    a first gate, having a first input coupled to the output of the exclusive-OR function and having a second input coupled to the shift clock output of the phase detector, for blocking shift signals from being applied to the shift clock input of the first digital delay line responsive to the exclusive-OR function determining that the contents of the latch differ from the current state of the direction signal;
    a second digital delay line, having an input coupled to receive the first delayed clock, for generating the feedback clock therefrom, the first digital delay line having a direction input coupled to the direction output of the phase detector, and having a shift clock input, the second digital delay line having a delay length that is selectively incremented or decremented according to a signal at its direction input, responsive to receiving a shift signal at the shift clock input; and
    clock distribution circuitry, for receiving the first delayed clock and for distributing one or more chip clocks based thereupon.

2. The digital phase-locked loop of claim 1, wherein the first gate is for passing shift signals to the shift clock input of the first digital delay line responsive to the exclusive-OR function determining that the contents of the latch do not differ from the current state of the direction signal.

3. The digital phase-locked loop of claim 1, further comprising:
    a second gate, having a first input coupled to the output of the exclusive-OR function, and having a second input coupled to the shift clock output of the phase detector, for blocking shift signals from being applied to the shift clock input of the first digital delay line responsive to the exclusive-OR function determining that the contents of the latch do not differ from the current state of the direction signal.

4. The digital phase-locked loop of claim 3, wherein the second gate is for passing shift signals to the shift clock input of the second digital delay line responsive to the exclusive-OR function determining that the contents of the latch differ from the current state of the direction signal.

5. The digital phase-locked loop of claim 1, wherein the latch has a clock input for receiving a clock signal, responsive to which the state of the direction signal is stored;
    and wherein the shift clock output of the phase detector is coupled to the clock input of the latch.

6. The digital phase-locked loop of claim 5, wherein the shift clock output of the phase detector is coupled to the clock input of the latch in such a manner that the latch stores the state of the direction signal responsive to a trailing edge of the shift signal.

7. The digital phase-locked loop of claim 1, further comprising:
    a clock buffer having an input coupled to receive the first delayed signal from the first digital delay line, and having an output coupled to the clock distribution circuitry.

8. A method for generating a chip clock in a substantially constant phase relationship relative to a system clock, comprising the steps of:
    receiving a system clock;
    applying the system clock to a first digital delay line to generate a first delayed clock;
    distributing at least one clock signal based upon the first delayed clock to a circuit function;
    generating a feedback clock by applying the first delayed clock to a second digital delay line;
    monitoring the phase relationship of corresponding edges of the system clock and the feedback clock;
    responsive to the monitoring step detecting that corresponding edges of the system clock and the feedback clock differ in time by more than a selected threshold, generating a direction signal having a state indicating which of the system clock and feedback clock leads the other;
    then storing a state of the direction signal for later use;
    comparing the stored state of the direction signal with a current state of the direction signal;
    responsive to the comparing step indicating that the stored direction signal matches the current state of the direction signal, incrementally varying the delay length of the first digital delay line in a direction corresponding to the current state of the direction signal; and
    responsive to the comparing step indicating that the stored direction signal does not match the current state of the direction signal, incrementally varying the delay length of the second digital delay line in a direction corresponding to the current state of the direction signal.

9. The method of claim 8, wherein the step of incrementally varying the delay length of the first digital delay line comprises:
    responsive to the direction signal indicating that the feedback clock leads the system clock, lengthening the delay length of the first digital delay line; and
    responsive to the direction signal indicating that the feedback clock lags the system clock, reducing the delay length of the first digital delay line.

10. The method of claim 9, further comprising:
    responsive to the monitoring step detecting that corresponding edges of the system clock and the feedback clock differ in time by more than a selected threshold, generating a shift clock pulse;
    wherein the lengthening and reducing steps are performed responsive to the first digital delay line receiving the shift clock pulse at a shift clock input.

11. The method of claim 10, further comprising:
responsive to the comparing step indicating that the stored direction signal matches the current state of the direction signal, applying the shift clock pulse to a shift clock input of the first digital delay line; and
responsive to the comparing step indicating that the stored direction signal does not match the current state of the direction signal, blocking the shift clock pulse from the shift clock input of the first digital delay line.

12. The method of claim 9, wherein the step of incrementally varying the delay length of the second digital delay line comprises:
responsive to the direction signal indicating that the feedback clock leads the system clock, lengthening the delay length of the second digital delay line; and
responsive to the direction signal indicating that the feedback clock lags the system clock, reducing the delay length of the second digital delay line.

13. The method of claim 10, further comprising:
responsive to the monitoring step detecting that corresponding edges of the system clock and the feedback clock differ in time by more than a selected threshold, generating a shift clock pulse;
wherein the step of incrementally varying the delay length of the second digital delay line comprises:
responsive to the direction signal indicating that the feedback clock leads the system clock, lengthening the delay length of the second digital delay line; and
responsive to the direction signal indicating that the feedback clock lags the system clock, reducing the delay length of the second digital delay line;
and wherein the lengthening and reducing steps are performed responsive to the first digital delay line receiving the shift clock pulse at a shift clock input.

14. The method of claim 13, further comprising:
responsive to the comparing step indicating that the stored direction signal does not match the current state of the direction signal, applying the shift clock pulse to a shift clock input of the second digital delay line; and
responsive to the comparing step indicating that the stored direction signal matches the current state of the direction signal, blocking the shift clock pulse from the shift clock input of the second digital delay line.

15. An integrated circuit, comprising:
a logic function, having a clock input; and
a digital phase-locked loop, comprising:
a phase detector, having a first input for receiving a system clock and a second input for receiving a feedback clock, for generating a shift signal at a shift clock output responsive to a detecting a phase difference between the system and feedback clocks, and for generating a direction signal at a direction output indicating which of the system and feedback clocks leads the other;
a latch, for storing the state of the direction signal;
an exclusive-OR function, having a first input coupled to the output of the latch and a second input coupled to receive the direction signal from the phase detector, for comparing the contents of the latch corresponding to a stored state of the direction signal with the current state of the direction signal;
a first digital delay line, having an input coupled to receive the system clock, for generating a first delayed clock from the system clock, the first digital delay line having a direction input coupled to the direction output of the phase detector, and having a shift clock input, the first digital delay line having a delay length that is selectively incremented or decremented according to a signal at its direction input, responsive to receiving a shift signal at the shift clock input;
a first gate, having a first input coupled to the output of the exclusive-OR function and having a second input coupled to the shift clock output of the phase detector, for blocking shift signals from being applied to the shift clock input of the first digital delay line responsive to the exclusive-OR function determining that the contents of the latch differ from the current state of the direction signal;
a second digital delay line, having an input coupled to receive the first delayed clock, for generating the feedback clock therefrom, the first digital delay line having a direction input coupled to the direction output of the phase detector, and having a shift clock input, the second digital delay line having a delay length that is selectively incremented or decremented according to a signal at its direction input, responsive to receiving a shift signal at the shift clock input; and
clock distribution circuitry, for receiving the first delayed clock and for applying, to the clock input of the logic function, a chip clock based upon the first delayed clock.

16. The integrated circuit of claim 15, wherein the digital phase locked loop further comprises:
a second gate, having a first input coupled to the output of the exclusive-OR function, and having a second input coupled to the shift clock output of the phase detector, for blocking shift signals from being applied to the shift clock input of the first digital delay line responsive to the exclusive-OR function determining that the contents of the latch do not differ from the current state of the direction signal.

17. An electronic system, comprising:
a clock generator circuit for generating a system clock;
a plurality of integrated circuits, at least one of the plurality of integrated circuits comprising:
a logic function, having a clock input; and
a digital phase-locked loop, comprising:
a phase detector, having a first input for receiving the system clock and a second input for receiving a feedback clock, for generating a shift signal at a shift clock output responsive to detecting a phase difference between the system and feedback clocks, and for generating a direction signal at a direction output indicating which of the system and feedback clocks leads the other;
a latch, for storing the state of the direction signal;
an exclusive-OR function, having a first input coupled to the output of the latch and a second input coupled to receive the direction signal from the phase detector, for comparing the contents of the latch corresponding to a stored state of the direction signal with the current state of the direction signal;
a first digital delay line, having an input coupled to receive the system clock, for generating a first delayed clock from the system clock, the first digital delay line having a direction input coupled to the direction output of the phase detector, and having a shift clock input, the first digital delay line having a delay length that is selectively incremented or decremented according to a signal at its direction input, responsive to receiving a shift signal at the shift clock input;

a first gate, having a first input coupled to the output of the exclusive-OR function and having a second input coupled to the shift clock output of the phase detector, for blocking shift signals from being applied to the shift clock input of the first digital delay line responsive to the exclusive-OR function determining that the contents of the latch differ from the current state of the direction signal;

a second digital delay line, having an input coupled to receive the first delayed clock, for generating the feedback clock therefrom, the first digital delay line having a direction input coupled to the direction output of the phase detector, and having a shift clock input, the second digital delay line having a delay length that is selectively incremented or decremented according to a signal at its direction input, responsive to receiving a shift signal at the shift clock input; and clock distribution circuitry, for receiving the first delayed clock and for applying, to the clock input of the logic function, a chip clock based upon the first delayed clock.

18. The system of claim 17, wherein the digital phase locked loop in the one of the plurality of integrated circuits further comprises:

a second gate, having a first input coupled to the output of the exclusive-OR function, and having a second input coupled to the shift clock output of the phase detector, for blocking shift signals from being applied to the shift clock input of the first digital delay line responsive to the exclusive-OR function determining that the contents of the latch do not differ from the current state of the direction signal.

* * * * *